United States Patent
Sugiyama

(10) Patent No.: US 7,973,457 B2
(45) Date of Patent: Jul. 5, 2011

(54) CRYSTAL UNIT

(75) Inventor: Toshio Sugiyama, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/759,482

(22) Filed: Apr. 13, 2010

(65) Prior Publication Data

US 2010/0259131 A1  Oct. 14, 2010

(30) Foreign Application Priority Data

Apr. 14, 2009  (JP) .................................. 2009-097897

(51) Int. Cl.
    *H01L 41/18*  (2006.01)
(52) U.S. Cl. ..................................................... 310/360
(58) Field of Classification Search .................... 310/360
    See application file for complete search history.

(56) References Cited

U.S. PATENT DOCUMENTS

| | | | | |
|---|---|---|---|---|
| 4,375,604 A * | 3/1983 | Vig | ................ | 310/312 |
| 4,701,661 A * | 10/1987 | Warner et al. | ................ | 310/360 |
| 7,157,983 B2 * | 1/2007 | Tanaka | ................ | 331/158 |
| 7,352,256 B2 | 4/2008 | Oita | | |
| 2003/0218512 A1 * | 11/2003 | Zhang et al. | ................ | 331/158 |
| 2004/0173141 A1 * | 9/2004 | Obara et al. | ................ | 117/200 |
| 2004/0251774 A1 * | 12/2004 | Tanaka | ................ | 310/311 |
| 2008/0203858 A1 * | 8/2008 | Onoe et al. | ................ | 310/361 |

FOREIGN PATENT DOCUMENTS

| | | |
|---|---|---|
| JP | 56-122516 A | 9/1981 |
| JP | 11-177376 A | 7/1999 |
| JP | 2006-345115 A | 12/2006 |

* cited by examiner

*Primary Examiner* — Thomas M Dougherty

(74) *Attorney, Agent, or Firm* — Carrier Blackman & Associates, P.C.; Joseph P. Carrier; William D. Blackman

(57) ABSTRACT

A double rotation Y-cut crystal unit includes a crystal element, which is respectively rotated by an angle θ° and an angle φ° in a counterclockwise direction centering on an X axis and a Z axis of crystal axes (X, Y, Z), which principal surface is perpendicular to a Y" axis of newly-generated rotated crystal axes (X', Y", Z'), and which is formed into a rectangular geometry longer in one direction, wherein when the X' axis is rotated by an angle α° in the counterclockwise direction with the Y" axis serving as a central axis in a plane of X'-Z' of the rotated crystal axes serving as the principal surface, a direction of a long side of the crystal element corresponds to the rotated X' axis direction, and wherein the angle α° is set to (30−φ)°±45°.

3 Claims, 4 Drawing Sheets

CRYSTAL UNIT

TECHNICAL FIELD

The present invention relates to a technical field of a double rotation Y-cut crystal unit, and in particular, to an SC-cut crystal unit in which crystal impedance (CI) in C mode relative to CI in B mode is made smaller.

BACKGROUND ART

Double rotation Y-cut crystal units such as SC-cut crystal units are excellent in thermal-shock characteristics and the like. Therefore, the double rotation Y-cut crystal units are used for highly-stabilized crystal oscillators of a constant-temperature type, for example. In the SC-cut crystal unit, there is not only a C mode that is for the main vibration, but also a B mode leading to an abnormal oscillation (frequency jump) due to a vibrational frequency approaching that in C mode. Therefore, it has been demanded to suppress the B mode so as to secure an oscillation in the C mode.

FIGS. 3a and 3b are diagrams for explanation of one example of a related-art crystal unit, in which FIG. 3a is a cutting azimuthal chart of an SC-cut crystal element, and FIG. 3b is a view of a crystal element.

The crystal unit is composed of an SC-cut crystal element 1. A principal surface of the crystal element 1 is perpendicular to the Y″ axis of newly rotated crystal axes (X', Y″, Z') that are rotated to the left that is a counterclockwise rotation at θ° (approximately 33°) and φ° (approximately 22°) centering on the X axis and the Z axis of crystal axes (X, Y, Z). In short, the crystal unit is composed of a double rotation Y-cut crystal plate, in which the principal surface (Y surface) perpendicular to the Y axis is rotated to the left at θ° and φ° centering on the X axis and the Y axis.

In reality, for example, the double rotation Y-cut plate is rotated at θ° centering on the X axis, and is thereafter rotated at φ° centering on the Z' axis that is newly generated. Alternatively, the double rotation Y-cut plate is rotated to the left at φ° centering on the Z axis, and is thereafter rotated to the left at φ° centering on the X' axis newly generated. Generally, θ is referred to as a direction angle, and φ is referred to as a tilt angle, and a direction angle θ has an effect on a temperature characteristic (peak temperature) and a tilt angle φ has an effect on the CI.

Further, as shown in FIG. 4, the crystal is a trigonal crystal. Therefore, X axes (solid lines) serving as electric axes exist at intervals of 120°, and Y axes (chain lines) serving as mechanical axes exist so as to be perpendicular to the X axis. Incidentally, FIG. 4 is a cross sectional view, in which the direction passing through the sheet plane is the Z axis serving as an optical axis, and which is perpendicular to the Z axis. Accordingly, the tilt angle φ(22°) as an SC-cut crystal element is (30−φ)° by use of the Y axis rotated by 30° in the counterclockwise direction as a standard, that is, an angle rotated in the clockwise direction by 8° by use of the rotation angle 30° from the X axis as a standard.

The crystal element 1 is formed into a rectangular geometry longer in the X'-axis direction, for example, and the X' axis is defined as a length L, the Z' axis is defined as a width W, and the Y″ axis is defined as a thickness T. Excitation electrodes (not shown) are formed on both principal surfaces of the crystal element 1, and leading electrodes extend from both sides of one end thereof, for example. Then, both sides of the one end of the crystal element 1, from which the leading electrodes extend, are held by unillustrated means, and the crystal element 1 is hermetically encapsulated to form the crystal unit.

CITATION LIST

Patent Literature

{PTL 1} JP-A-2006-345115
{PTL 2} JP-A-H11-177376 {PTL 3} JP-A-S56-122516

SUMMARY OF INVENTION

Technical Problem

However, in the crystal unit having the above-described configuration (SC-cut), B mode (secondary vibration) that is thickness-twisting vibration is generated so as to approach C mode (principal vibration) that is thickness-shear vibration, and CI in B mode and CI in C mode are equal to each other. Accordingly, there has been a problem that an abnormal oscillation in the B mode occurs with respect to an oscillation in the C mode.

Due to this fact, for example, JP-A-2006-345115 discloses to provide a resonant circuit with respect to oscillating frequencies in C mode and B mode in order to suppress the B mode to secure an oscillation in C mode. However, in this case, there has been a problem that an LC circuit or the like serving as a resonant circuit is required to complicate the circuit, which increases the number of components to complicate the design.

Incidentally, these problems occur in, not only an SC-cut crystal unit, but also a double rotation Y-cut crystal unit in which the B mode is generated with respect to the C mode in the same way. For example, these problems occur in the same way even in the cases of, for example, an IT-cut crystal unit in which a direction angle θ is 33° and a tilt angle φ is 19°, and an FC-cut crystal unit in which a direction angle θ is 33° and a tilt angle φ is 15° as well.

An object of the present invention is to provide a double rotation Y-cut crystal unit in which the CI in B mode with respect to that in C mode is made relatively large to make an oscillation in C mode easy.

Solution to Problem

According to a first aspect of the invention, there is provided a double rotation Y-cut crystal unit comprising: a crystal element, which is respectively rotated by an angle θ° and an angle φ° in a counterclockwise direction centering on an X axis and a Z axis of crystal axes (X, Y, Z), which principal surface is perpendicular to a Y″ axis of newly-generated rotated crystal axes (X', Y″, Z'), and which is formed into a rectangular geometry longer in one direction, wherein when the X' axis is rotated by an angle α° in the counterclockwise direction with the Y″ axis serving as a central axis in a plane of X'-Z' of the rotated crystal axes serving as the principal surface, a direction of a long side of the crystal element corresponds to the rotated X' axis direction, and wherein the angle α° is set to (30−φ)°±45°.

According to a second aspect of the invention, in the double rotation Y-cut crystal unit, wherein the double rotation Y-cut crystal unit is an SC-cut crystal unit, in which the crystal element is configured such that the angle θ is 33° and the angle φ is 22°.

According to a third aspect of the invention, in the double rotation Y-cut crystal unit according to claim 1, wherein the double rotation Y-cut crystal unit is an IT-cut crystal unit, in which the crystal element is configured such that the angle θ is 33° and the angle φ is 19°, or an FC-cut crystal unit, in which the angle θ is 33° and the angle φ is 15°.

ADVANTAGEOUS EFFECTS OF INVENTION

According to the aspects of the invention, as described by use of an SC-cut crystal unit as an example, the CI in B mode can be increased twentyfold with respect to that in C mode, to be dramatically larger. Accordingly, an abnormal oscillation in B mode is prevented to secure an oscillation in C mode.

According to the second and third aspects of the invention, the double rotation Y-cut crystal unit according to the first aspect is clarified, and moreover, the effect according to the first aspect is performed.

Incidentally, in JP-A-H11-177376, there is shown that X'±45° is set as an SC-cut crystal unit from the point of view of a stress sensitivity characteristic or the like. However, in the present invention, in the case of an SC-cut crystal unit, X'+53° or −37° is derived from the formula of (30−φ)°±45°. Therefore, the present invention completely differs from JP-A-H11-177376.

BRIEF DESCRIPTION OF THE DRAWINGS

FIGS. 3a and 3b are diagrams for explanation of one example of a related-art crystal unit, in which FIG. 3a is a cutting azimuthal chart of an SC-cut crystal element, and FIG. 3b is a view of a crystal element.

DESCRIPTION OF EMBODIMENTS

Figure 1:
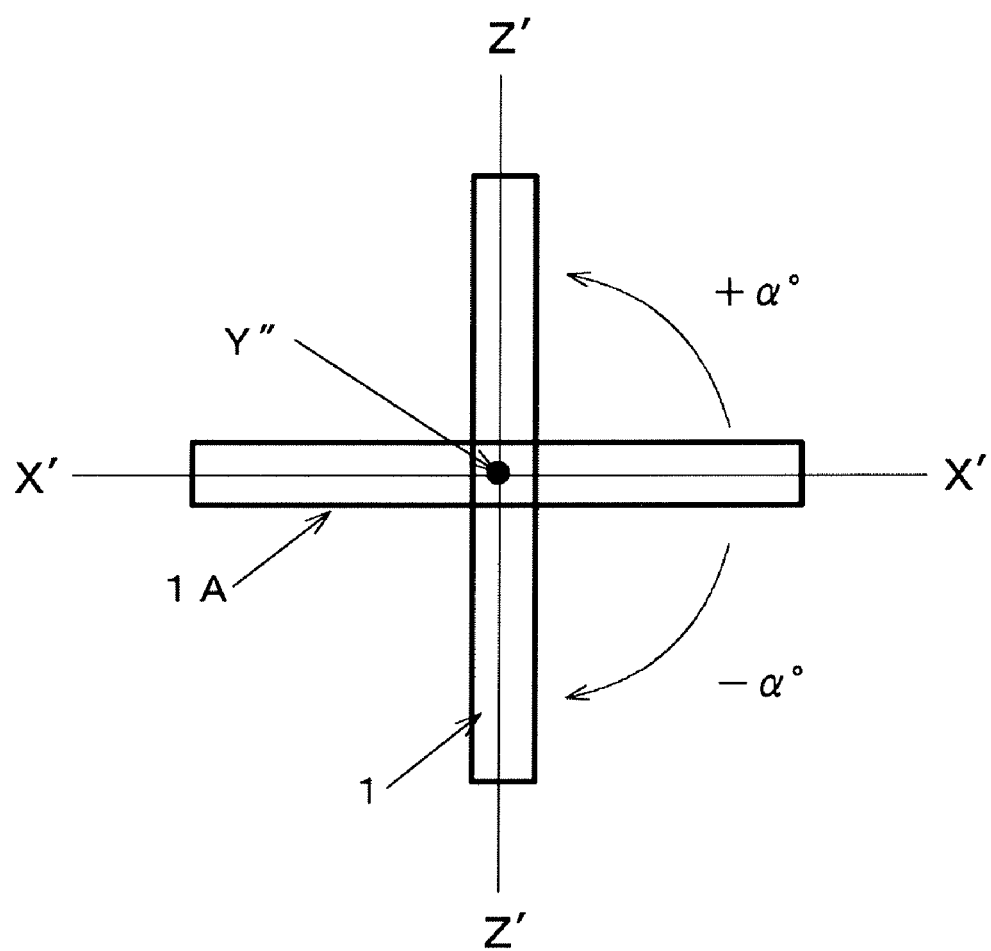
FIG. 1 is an in-plane rotation diagram of a crystal element (SC-cut) for explanation of one embodiment of the present invention.

Hereinafter, one embodiment of the present invention will be described with reference to FIG. 1 (in-plane rotation diagram) and FIG. 2 (CI characteristic diagram). Incidentally, portions which are the same as those in the related example are denoted by the same numbers, and descriptions thereof will be simplified or omitted.

Figure 3A:
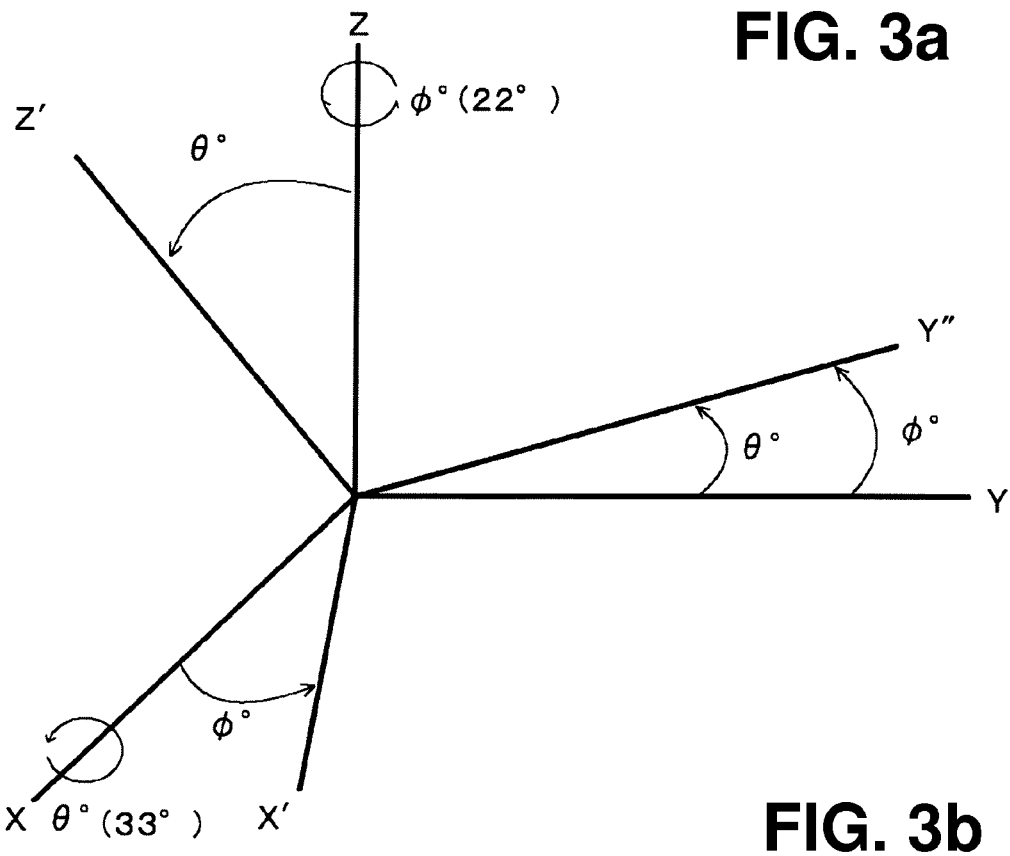
Figure 3B:
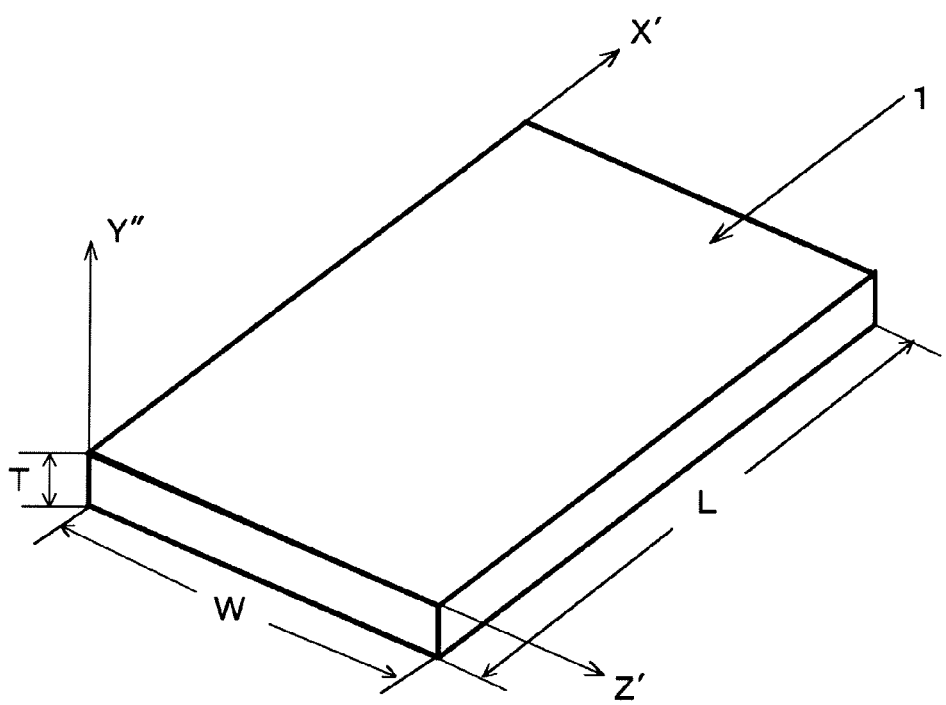
Figure 4:
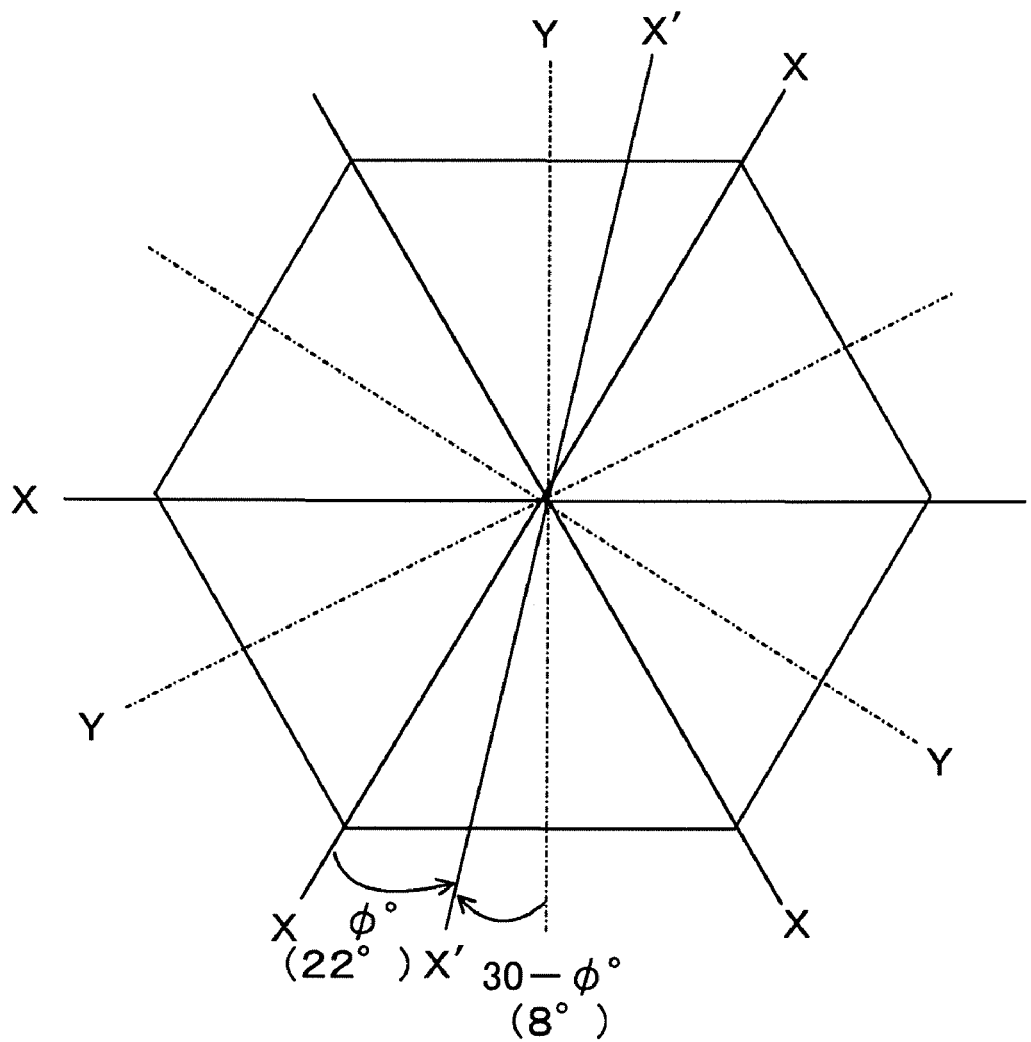
FIG. 4 is a cross sectional view showing a plane surface perpendicular to the Z axis of a crystal (quartz) for explanation of the related example.

The crystal unit is composed of an SC-cut crystal element 1 whose principal surface is perpendicular to the Y" axis of the rotated crystal axes (X', Y", Z') with a direction angle θ of 33° and a tilt angle φ of 22° centering on the X axis and the Z axis of the crystal axes (X, Y, Z) (refer to FIGS. 3a and 3b). In this case, the tilt angle φ (22° of a counterclockwise rotation from the X axis is (30−φ)° expressed from the Y axis rotated in the same direction by 30° from the X axis, as described above (refer to FIG. 4).

The crystal element 1 is formed into a rectangular geometry longer in the X'-axis direction with the Y" axis defined as a thickness T, the X' axis defined as a length L, and the Z' axis defined as a width W, and the crystal element 1 serves as a standard crystal element 1A. For example, the length L is set to 3.2 mm, and the width W is set to 1.8 mm, which leads to a ratio of the sides L/W of 1.8. Incidentally, provided that a ratio of the sides L/W is set to approximately 1.8 or more, the CI in B mode with respect to that in C mode can be basically increased (refer to JP-A-S56-122516). Then, in the present embodiment, as shown in FIG. 1, the standard crystal element 1 is in-plane rotated by use of the X' axis (tilt angle φ=22° as a standard (0°) in the plane surface of X'-Z' that is the principal surface thereof, to acquire CI values of the respective crystal elements 1 in that case.

Figure 2:
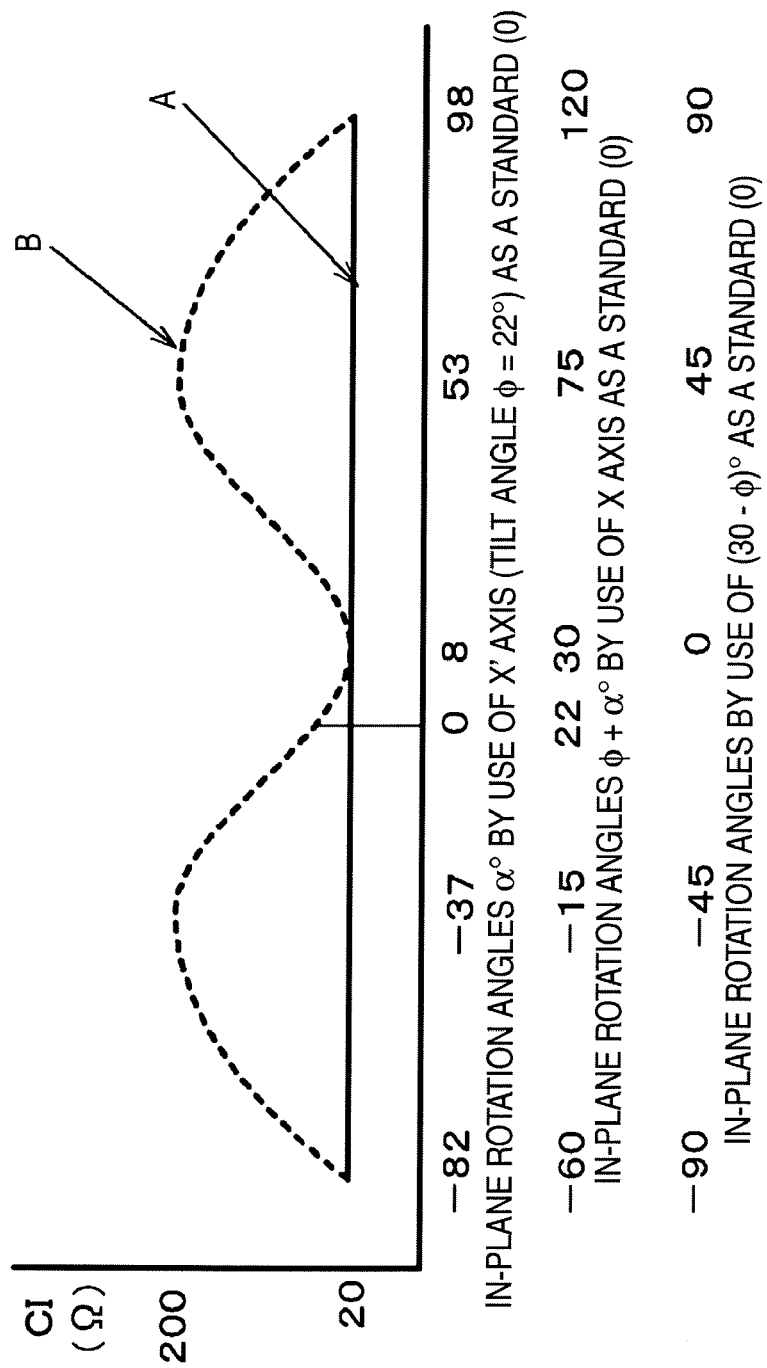
FIG. 2 is a CI characteristic diagram with respect to the in-plane rotation for explanation of the one embodiment of the present invention.

FIG. 2 is a basic CI characteristic view based on an experimental result with respect to the in-plane rotation. However, in-plane rotation angles α when the crystal element is rotated within a range of approximately ±90 in the counterclockwise direction and in the clockwise direction by use of the X' axis as a standard (0) are plotted on the abscissa.

Further, CI values in C mode (the curved line A) and B mode (the curved line B) with respect to the in-plane rotation angles α are plotted on the ordinate.

Here, when the in-plane rotation angles α by use of the X' axis as a standard use the X axis as a standard (0), a tilt angle φ (22°) is added thereto, and the in-plane rotation angles α become (φ+α). Further, because a tilt angle φ from the X axis is (30−φ)° as described above, the in-plane rotation angles α can be indicated by use of (30−φ)° as a standard as well. Incidentally, the standard crystal element 1A and the crystal element 1 in the experiment are held with both sides of their one ends of the leading electrodes extending from the excitation electrodes (not shown) on both principal surfaces thereof.

As is shown in FIG. 2, when the in-plane rotation angles α by use of the X' axis as a standard are within a range of ±90°, the CI in C mode (the curved line A) is made substantially constant which is 20Ω. This is because the C mode (thickness-shear vibration) is sufficiently excited even when a length of the X axis is changed by an in-plane rotation, not to have an effect on the CI.

In contrast, the CI (the curved line B) in B mode reaches 20Ω which is the minimum value equal to that in C mode at 8° as an in-plane rotation angle α from the X', and at 98° and −82° which are 8°±90°. Then, the CI in B mode reaches approximately 200Ω which is the maximum value at 53° and −37° which are 8°±45°. In short, the CI in B mode centers on the in-plane rotation angle α=8° from the X' axis (minimum value), and reaches the maximum value at ±45° thereof, and reaches the minimum value at ±90° thereof.

With these facts, an in-plane rotation angle α° from the X' axis is set to 53° and −37°, which makes it possible to increase a ratio B/C of the CI in B mode with respect to the CI in C mode in an SC-cut crystal unit substantially twentyfold, to be dramatically greater. Thereby, an abnormal oscillation in B mode is prevented to make an oscillation in C mode easy. Then, for example, as compared with the case of suppressing B mode by using an LC circuit, the number of components is decreased, to make the circuit design easy.

In the above-described embodiment, in the SC-cut crystal unit, the in-plane rotation angles α from the X' axis (tilt angle φ=22° at which the CI in B mode is minimized are 8° (8°±90°, and the in-plane rotation angles α at which the CI in B mode is maximized are 8°±45°. Meanwhile, as described above, the in-plane rotation angle α=8° corresponds to (30−φ)°. Accordingly, the in-plane rotation angles α=(8°±45° at which the CI is maximized can be expressed as (30−φ)°±45°. In this case, the CI in B mode is minimized at (30−φ)°±90°, and is maximized at (30−φ)°±45° which is intermediate therebetween.

These facts bring about the same phenomenon in the case of a double rotation Y-cut crystal unit having a C mode and a B mode other than the SC-cut crystal unit in the above-described example, for example, an IT-cut crystal unit in which a tilt angle φ which is a rotation angle from the X axis is 19°. Accordingly, when a rotation angle from the X axis is (30−φ)°±45°, the CI in B mode is maximized to make a ratio B/C with respect to the CI in C mode dramatically greater. With these facts, the present invention can be basically applied to, not only an SC-cut crystal unit, but also a double rotation Y-cut crystal unit having a C mode and a B mode.

REFERENCE SIGN LIST

1 . . . Crystal element, 1A . . . Standard crystal element

The invention claimed is:

1. A double rotation Y-cut crystal unit comprising:
a crystal element, which is respectively rotated by an angle $\theta°$ and an angle $\phi°$ in a counterclockwise direction centering on an X axis and a Z axis of crystal axes (X, Y, Z), which principal surface is perpendicular to a Y" axis of newly-generated rotated crystal axes (X', Y", Z'), and which is formed into a rectangular geometry longer in one direction,
wherein when the X' axis is rotated by an angle $\alpha°$ in the counterclockwise direction with the Y" axis serving as a central axis in a plane of X'-Z' of the rotated crystal axes serving as the principal surface, a direction of a long side of the crystal element corresponds to the rotated X' axis direction, and
wherein the angle $\alpha°$ is set to $(30-\phi)°\pm 45°$.

2. The double rotation Y-cut crystal unit according to claim 1,
wherein the double rotation Y-cut crystal unit is an SC-cut crystal unit, in which the crystal element is configured such that the angle $\theta$ is 33° and the angle $\phi$ is 22°.

3. The double rotation Y-cut crystal unit according to claim 1,
wherein the double rotation Y-cut crystal unit is an IT-cut crystal unit, in which the crystal element is configured such that the angle $\phi$ is 33° and the angle $\phi$ is 19°, or an FC-cut crystal unit, in which the angle $\theta$ is 33° and the angle $\phi$ is 15°.

* * * * *